US007166511B2

United States Patent
Oh

(10) Patent No.: US 7,166,511 B2
(45) Date of Patent: Jan. 23, 2007

(54) METHOD FOR FABRICATING SPLIT GATE FLASH MEMORY DEVICE

(75) Inventor: Sang Hun Oh, Bucheon (KR)

(73) Assignee: Dongbu Electronics, Seoul (KR)

( * ) Notice: Subject to any disclaimer, the term of this patent is extended or adjusted under 35 U.S.C. 154(b) by 107 days.

(21) Appl. No.: 11/024,478

(22) Filed: Dec. 30, 2004

(65) Prior Publication Data

US 2005/0142698 A1   Jun. 30, 2005

(30) Foreign Application Priority Data

Dec. 31, 2003   (KR) .................. 10-2003-0101753

(51) Int. Cl.
*H01L 21/336* (2006.01)
(52) U.S. Cl. .................. 438/257; 438/266; 438/267
(58) Field of Classification Search ................ 438/201, 438/211, 257, 266, 267
See application file for complete search history.

(56) References Cited

U.S. PATENT DOCUMENTS 6,124,609 A * 9/2000 Hsieh et al. .............. 257/315
6,436,764 B1 * 8/2002 Hsieh ........................ 438/257
6,958,274 B2 * 10/2005 Jung ......................... 438/261

* cited by examiner

*Primary Examiner*—Thao X. Le
*Assistant Examiner*—Mursalin B. Hafiz
(74) *Attorney, Agent, or Firm*—Mayer Brown Rowe & Maw LLP

(57) ABSTRACT

A method for fabricating a split gate flash memory includes depositing a second conductive layer for forming a control gate on a semiconductor substrate having a first conductive layer, an insulating layer, and an oxide layer on both sides of the first conductive layer formed thereon, filling an anti-implant protective layer in a depression of the second conductive layer, performing ion implant on the second conductive layer, removing the anti-implant protective layer filled in the depression of the second conductive layer, forming a photoresist pattern by depositing a photoresist layer on the second conductive layer for forming a control gate, and treating the photoresist layer with a light exposure and a development process, and forming the control gate by etching the second conductive layer.

6 Claims, 12 Drawing Sheets

METHOD FOR FABRICATING SPLIT GATE FLASH MEMORY DEVICE

BACKGROUND OF THE INVENTION

1. Field of the Invention

The present invention relates to a memory device, and more particularly, to a method for fabricating a split gate flash memory. Although the present invention is suitable for a wide scope of applications, it is particularly suitable for preventing polymer residue from being formed in a space between the split gate area on both sides of the flash memory device and for enhancing the electrical characteristics of the flash memory device.

2. Discussion of the Related Art

Flash memory technology has been continuously developed by enhancing the cell structure in various ways. Such variety of forms includes the stacked gate cell structure and the split gate cell structure. The stacked gate cell structure is formed of a sequential deposition of a floating gate and a control gate. The stacked gate cell has the problem of over-erasing, which occurs when the floating gate is excessively discharged. A threshold voltage of the excessively discharged cell has a negative (−) value. Accordingly, an electric current flows through even when a cell is not selected. In other words, the current flows when a read voltage is not applied to the control gate. The split gate cell structure has been proposed in order to prevent the problem of over-erasing.

FIG. 1 illustrates a cross-sectional view of a general split gate cell structure. Referring to FIG. 1, the split gate (type) cell structure includes an oxide-nitride-oxide (ONO) layer 20, a first conductive layer 30, being the floating gate, and an insulating layer (i.e., a nitride layer) 40 sequentially deposited on a semiconductor layer 10. An oxide layer 50 is formed on each side wall of the first conductive layer 30. A second conductive layer 60, being the control gate, is formed to cover only one side of the first conductive layer 30.

FIG. 2 illustrates a cross-sectional view of a control gate etching process in the related art method for fabricating a split gate flash memory. Referring to FIG. 2, a first conductive layer 20, a nitride layer 40, and an oxide layer 50 are formed. Then, a second conductive layer 60 is formed on the entire surface thereof. Subsequently, a photoresist layer 70 is deposited on the entire surface of the second conductive layer 60. After treating the photoresist layer 70 with a photolithography process and an etching process, a portion of the second conductive layer 60 remains, so as to form the control gate. The etching process of the second conductive layer is completed by removing the photoresist layer 70.

As described above, a split gate having a horizontally symmetrical structure is formed in a memory cell area. Herein, when depositing the second conductive layer 60 for forming the control gate pattern, the floating gate pattern, i.e., a deposition of the first conductive layer 30, the insulating layer 40, and the oxide layer 50, is already formed on the substrate. Therefore, step differences between the first conductive layer 30, the insulating layer 40, and the oxide layer 50 are formed, thereby causing a hollow groove (or depression) to be formed in the space between the two split gate areas, as shown in the dotted line of FIG. 2.

At this point, a photoresist layer 70 is deposited on the second conductive layer 60, and the photoresist layer 70 is treated with a light exposure process and a development process. Then, due to the above-described step difference, photoresist scum (Ps) may remain in the hollow groove portion (or depression area) of the second conductive layer 60. In addition, after forming the photoresist 70 pattern, a native oxide layer may be formed on the surface of the second conductive layer 60 in the portion having the photoresist layer 70 removed. Therefore, during a following control gate etching process, a reaction between the photoresist scum and the native oxide layer disturbs the etching process, thereby producing a polymer residue (Pr), which is a non-etched residue, in the space between the two split gate areas. However, the above-described space between the two split gate areas is a common drain area, which may cause deficiency in forming a silicide layer when the residue remains in this specific area, thereby increasing contact resistance, which in turn deteriorates the electrical characteristic of the device.

SUMMARY OF THE INVENTION

Accordingly, the present invention is directed to a method for fabricating a split gate flash memory that substantially obviates the above-identified and other problems due to limitations and disadvantages of the related art.

An object of the present invention is to provide a method for fabricating a split gate flash memory that can prevent polymer residue from being produced in a space between two split gate areas, thereby enhancing the electrical characteristics of the flash memory device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a split gate type flash memory device includes depositing a second conductive layer for forming a control gate on a semiconductor substrate having a first conductive layer, an insulating layer, and an oxide layer on both sides of the first conductive layer formed thereon, filling an anti-implant protective layer in a depression of the second conductive layer, performing ion implantation on the second conductive layer, removing the anti-implant protective layer filled in the depression of the second conductive layer, forming a photoresist pattern by depositing a photoresist layer on the second conductive layer for forming a control gate, and treating the photoresist layer with a light exposure process and a development process, and forming the control gate by etching the second conductive layer.

The filling of an anti-implant protective layer in a depression of the second conductive layer may include forming a photoresist layer as the anti-implant protective layer on the second conductive layer including the depression, and performing an etching process on the photoresist layer, so as to remove the photoresist layer excepting for the depression. Alternatively, the filling of an anti-implant protective layer in a depression of the second conductive layer may also include forming a photoresist layer as the anti-implant protective layer on an area of the second conductive layer corresponding to the depression.

On the other hand, the filling an anti-implant protective layer in a depression of the second conductive layer may include depositing a nitride layer as the anti-implant protective layer on the second conductive layer, and performing an etch back process on the nitride layer, so as to remove the nitride layer excepting for the depression. And, the performing an etching process on the photoresist layer, so as to remove the photoresist layer excepting for the depression may include performing a wet-etch process to remove the nitride layer filled in the depression. And, the ion implant process may include nitrogen (N+) implant.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
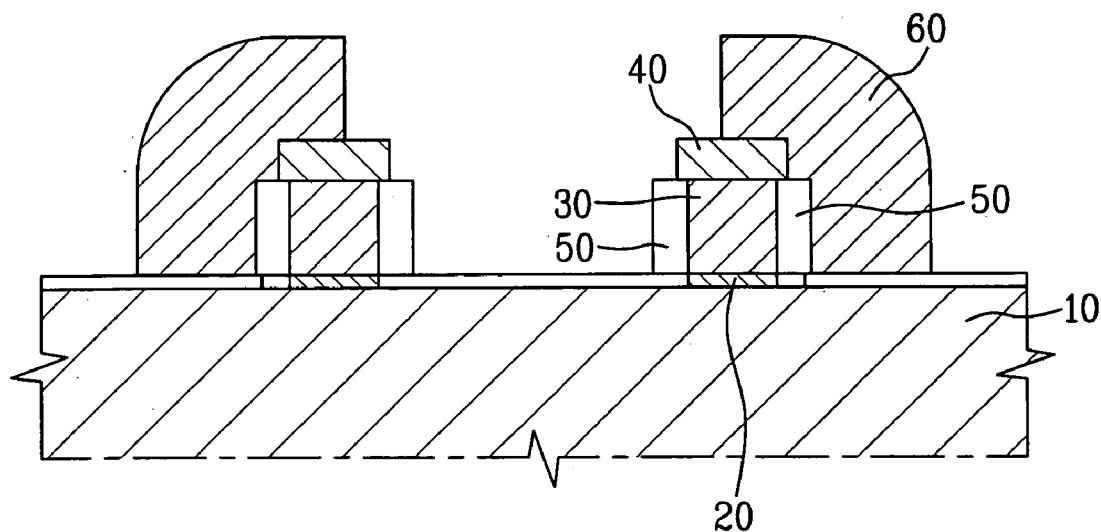
FIG. 1 illustrates a cross-sectional view of a conventional split gate cell structure.
Figure 2:
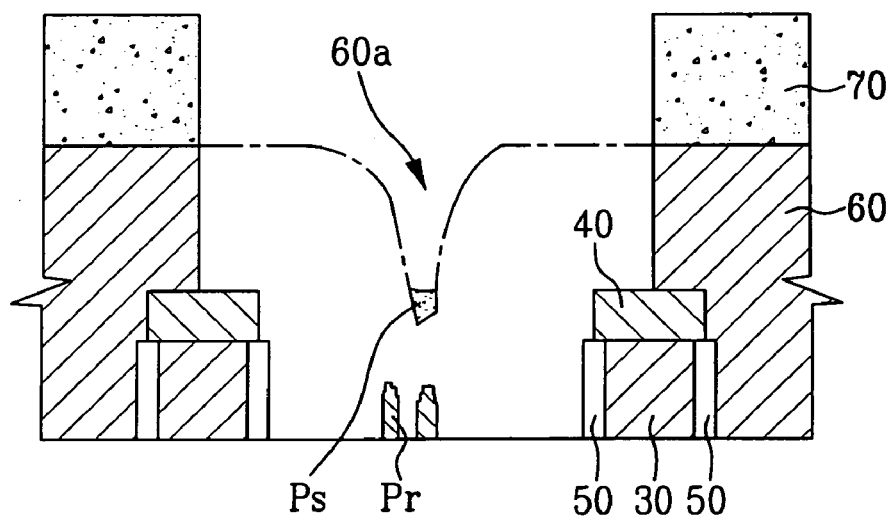
FIG. 2 illustrates a cross-sectional view of a conventional control gate etching process in the related art method for fabricating a split gate flash memory.
Figure 3A:
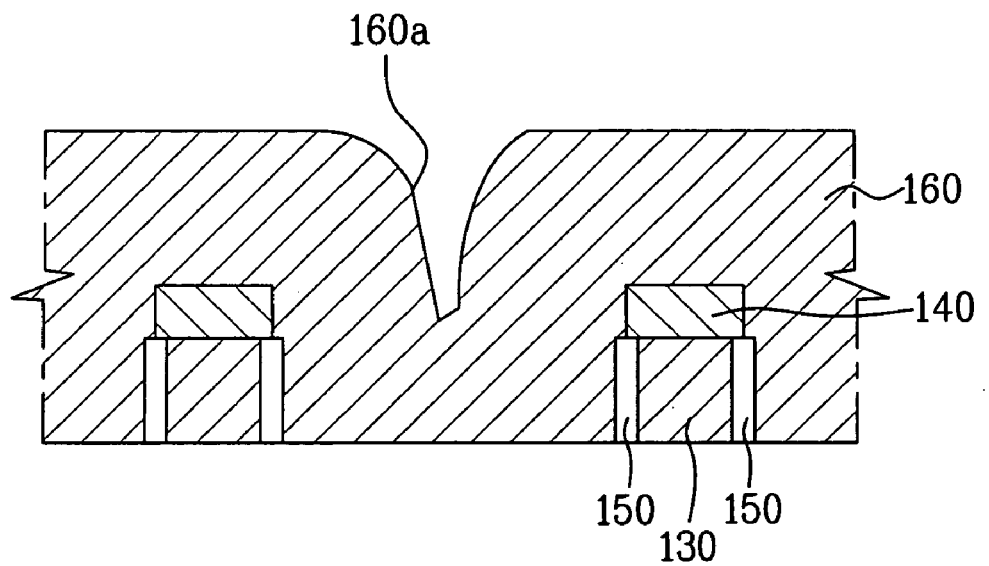
FIGS. 3A to 3G illustrate cross-sectional views showing the process steps of the method for fabricating a split gate flash memory according to a first embodiment of the present invention.

FIGS. 3A to 3G illustrate cross-sectional views showing the process steps of the method for fabricating a split gate flash memory according to a first embodiment of the present invention. Referring to FIG. 3A, a first conductive layer 130 is formed on a semiconductor substrate, an insulating layer 140 is formed on the first conductive layer 130, and an oxide layer 150 is formed on each side of the first conductive layer 130. Then, a second conductive layer 160 is formed on the entire surface thereof. When depositing the second conductive layer 160 as described above, due to the step difference between the first conductive layer 130, the insulating layer 140, and the oxide layers 150 on both sides of the conductive layer 130, a depression 160a may be formed between the two floating gates.

Figure 3B:
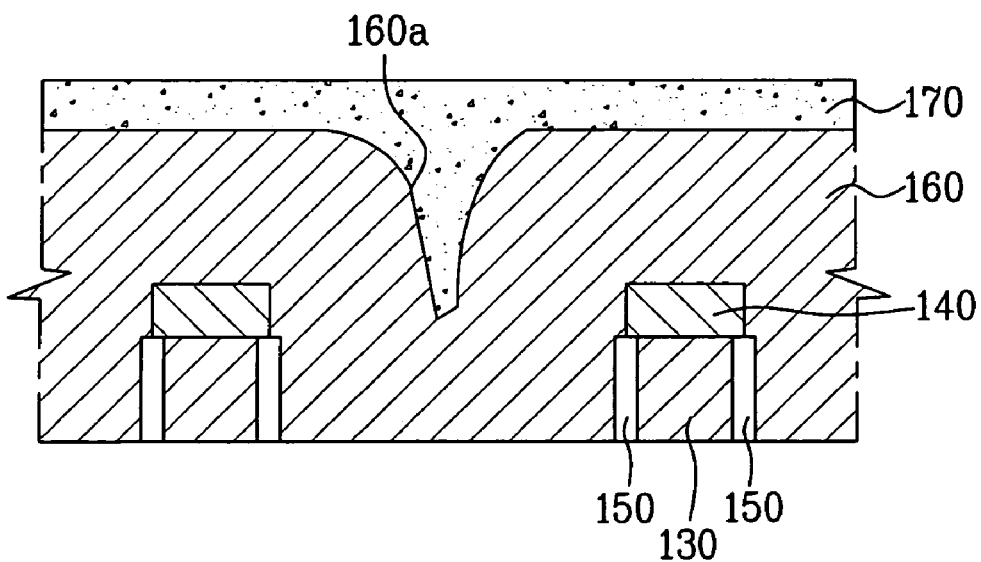
Figure 3C:
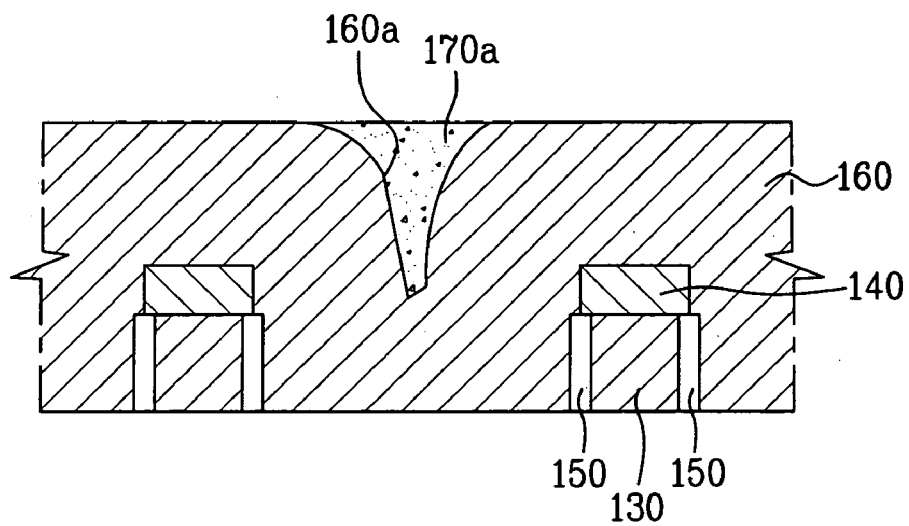
Figure 3D:
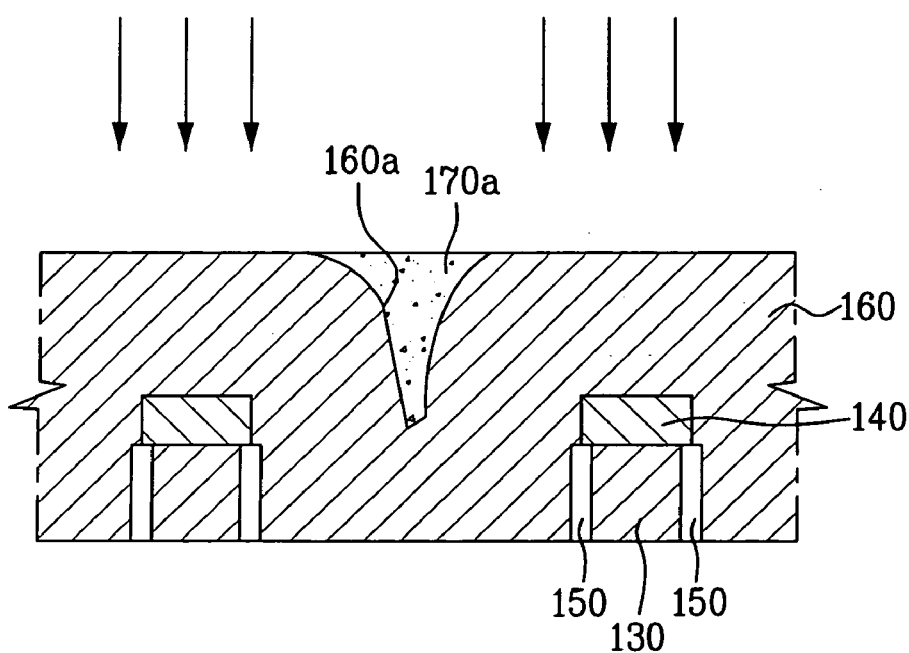

Then, referring to FIG. 3B, in order to neutralize (or eliminate) the topology caused by the depression 160a in the second conductive layer 160, a photoresist layer 170 is formed on the second conductive layer 160. Subsequently, as shown in FIG. 3C, the photoresist layer 170 is etched-back, so as to produce a photoresist residue 170a within the depression 160a of the second conductive layer 160. Thereafter, referring to FIG. 3D, an ion implant process is performed on the surface of the second conductive layer 160 and the photoresist residue 170a. Herein, it is preferable that the ion implant is performed with nitrogen (N+) ions.

As described above, when performing the ion implant process, the photoresist residue 170a filled in the depression 160a acts as a protective layer against the ion implant (i.e., an anti-implant protective layer). Therefore, nitrogen ion can be injected into the second conductive layer 160 with the exception of the depression 160a. Accordingly, the depression 160a of the second conductive layer 160 (i.e., the area perpendicular to the photoresist residue 170a) becomes a non-doping area, and the rest of the second conductive layer 160 excluding the depression 160a becomes a doping area.

Figure 3E:
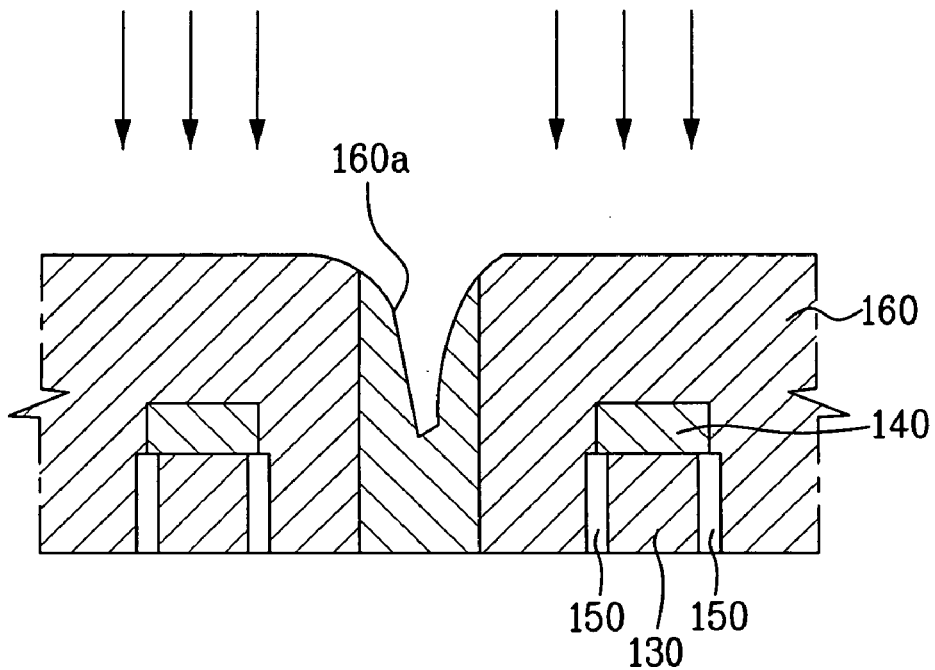
Figure 3F:
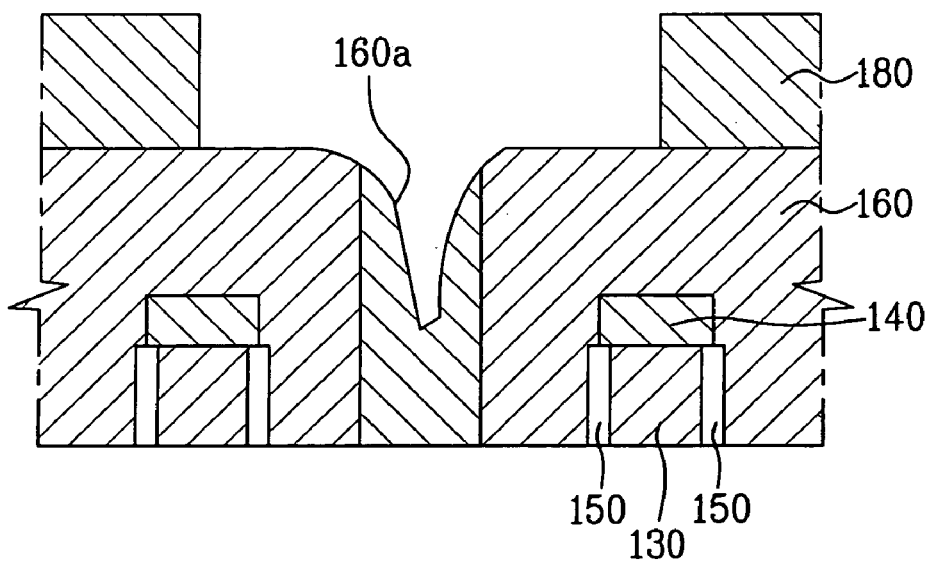
Figure 3G:
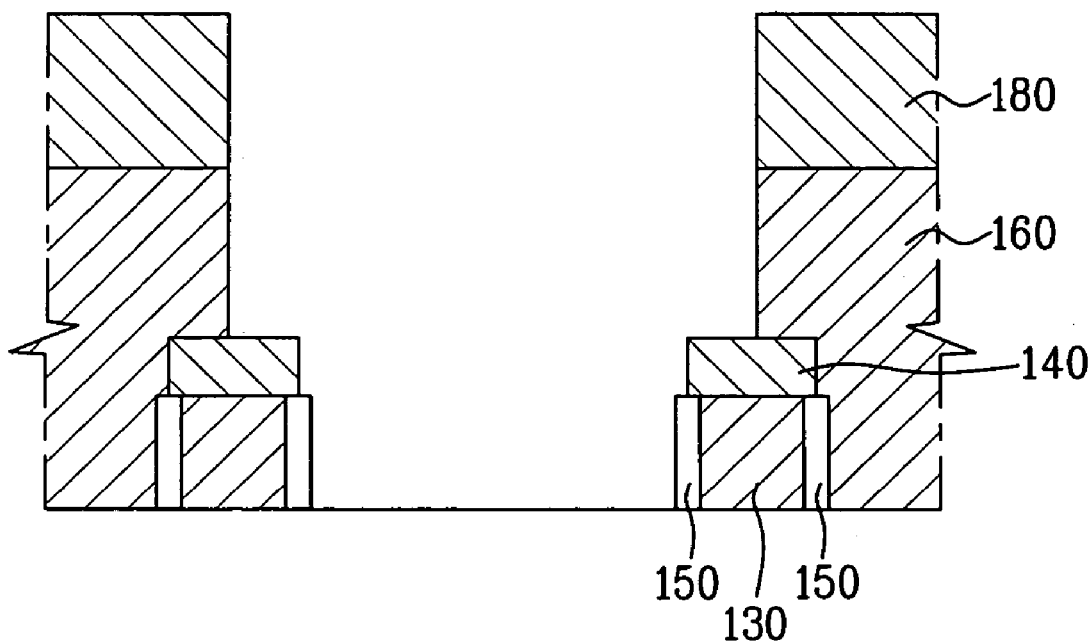

Subsequently, referring to FIG. 3E, the photoresist residue 170a is removed from the depression 160a. Thereafter, as shown in FIG. 3F, a photoresist pattern 180 for forming a control gate is formed on the second conductive layer 160. Then, referring to FIG. 3G, an etching process for forming a control gate is performed, thereby forming the control gate. Generally, when performing the etching process, the etch rate in the doping area is fast, whereas the etch rate in the non-doping area is slow. By using such characteristic, the present invention decreases the etch rate in the area having the step difference (i.e., the depression 160a), so as to repress non-etched material from being formed during the etching process.

FIGS. 4A to 4F illustrate cross-sectional views showing the process steps of the method for fabricating a split gate flash memory according to a second embodiment of the present invention. The second embodiment of the present invention is similar to the process described in the first embodiment of the present invention, apart from the structure of the anti-implant protective layer and the treatment process.

Figure 4A:
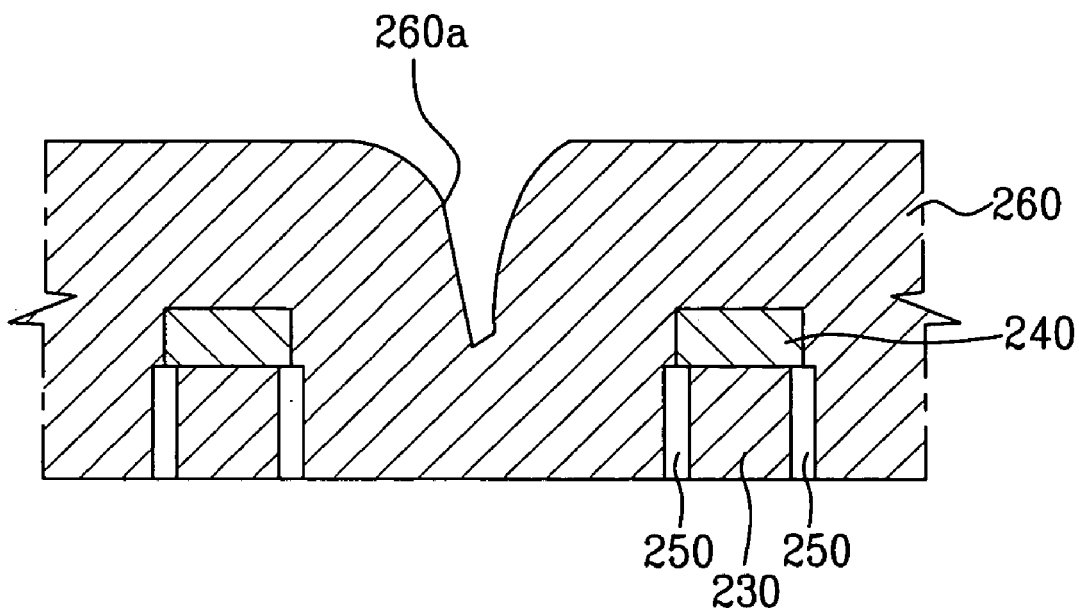
FIGS. 4A to 4F illustrate cross-sectional views showing the process steps of the method for fabricating a split gate flash memory according to a second embodiment of the present invention.
Figure 4B:
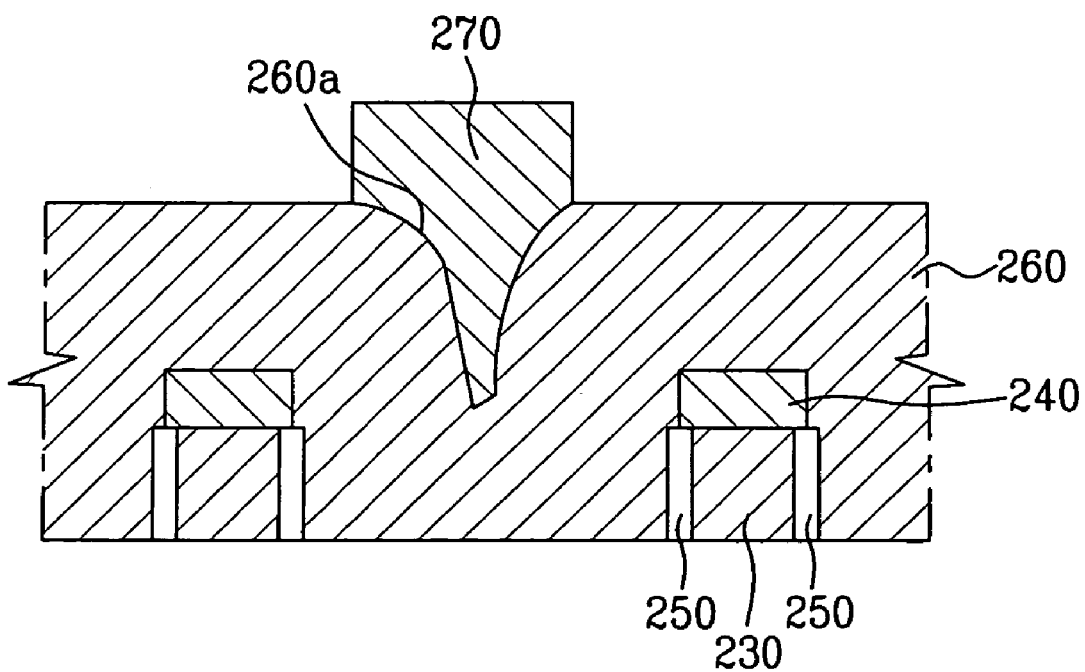

More specifically, referring to FIG. 4A, a first conductive layer 230 is formed on a semiconductor substrate, an insulating layer 240 is formed on the first conductive layer 230, and an oxide layer 250 is formed on each side of the first conductive layer 230. Then, a second conductive layer 260 is formed on the entire surface thereof. Then, as shown in FIG. 4B, a photoresist pattern 270 is formed, as an anti-implant protective layer, on an area corresponding to a depression 260a of the second conductive layer 260. After forming the photoresist pattern 270 on the depression 260a, the photoresist pattern 270 prevents doping from occurring in the depression 260a area of the second conductive layer 260.

Figure 4C:
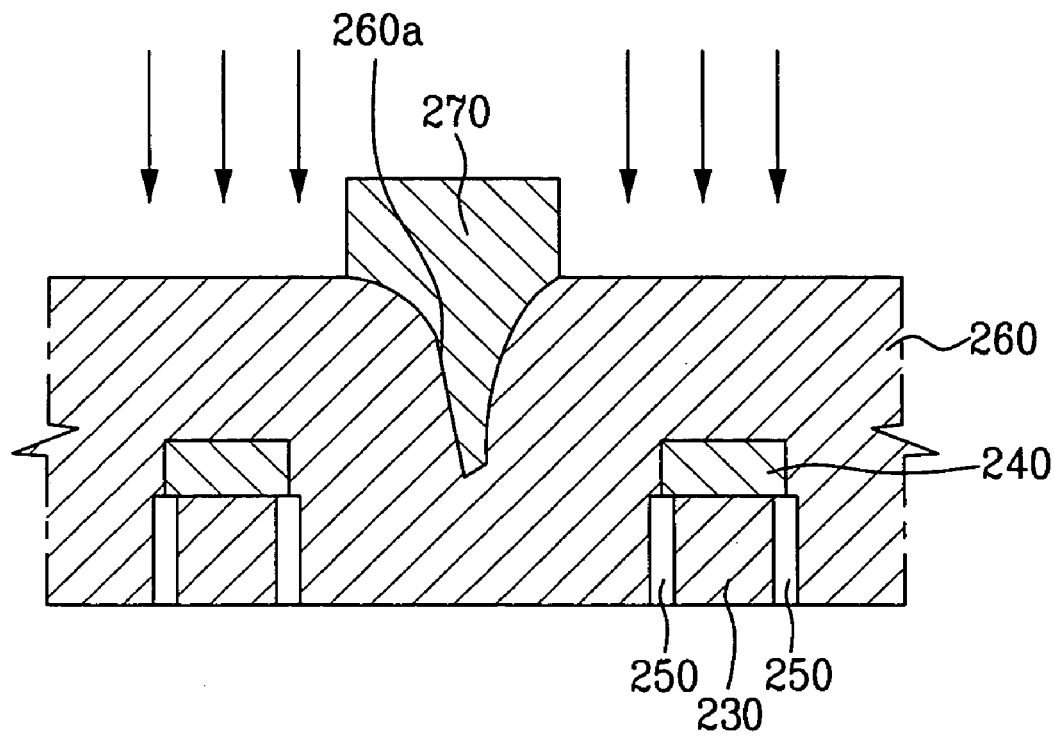
Figure 4D:
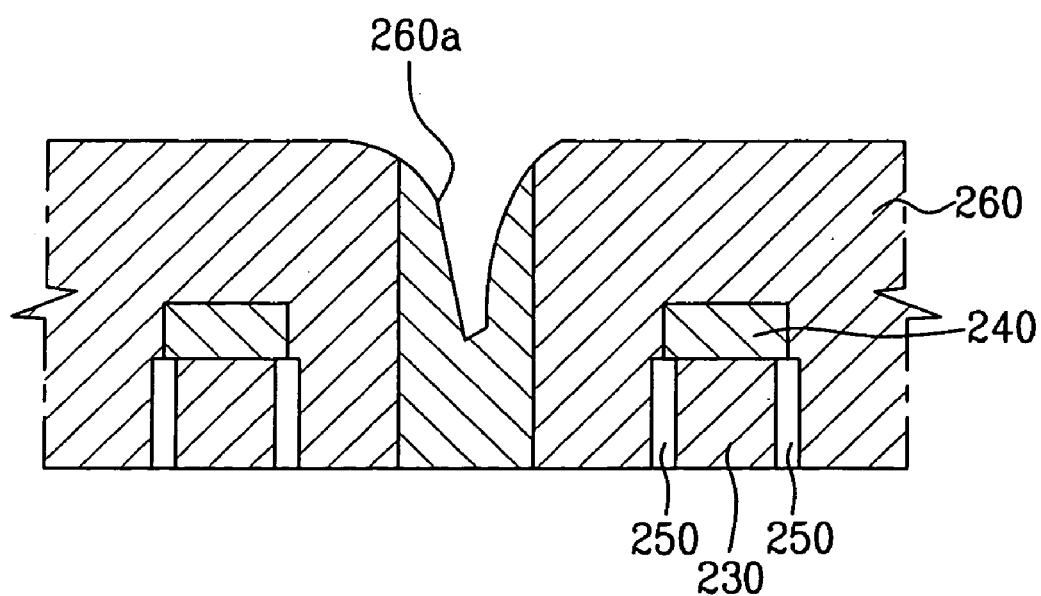
Figure 4E:
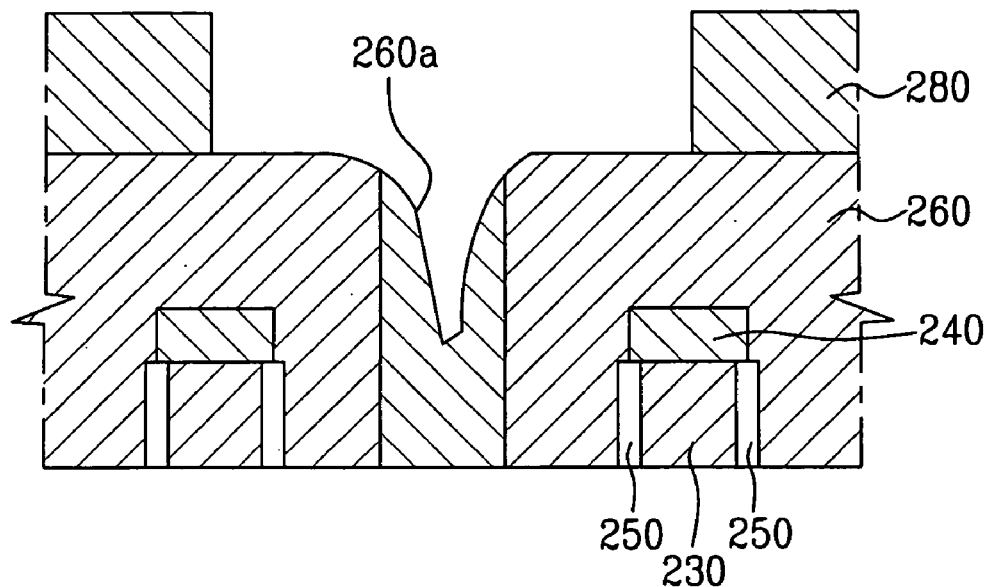
Figure 4F:
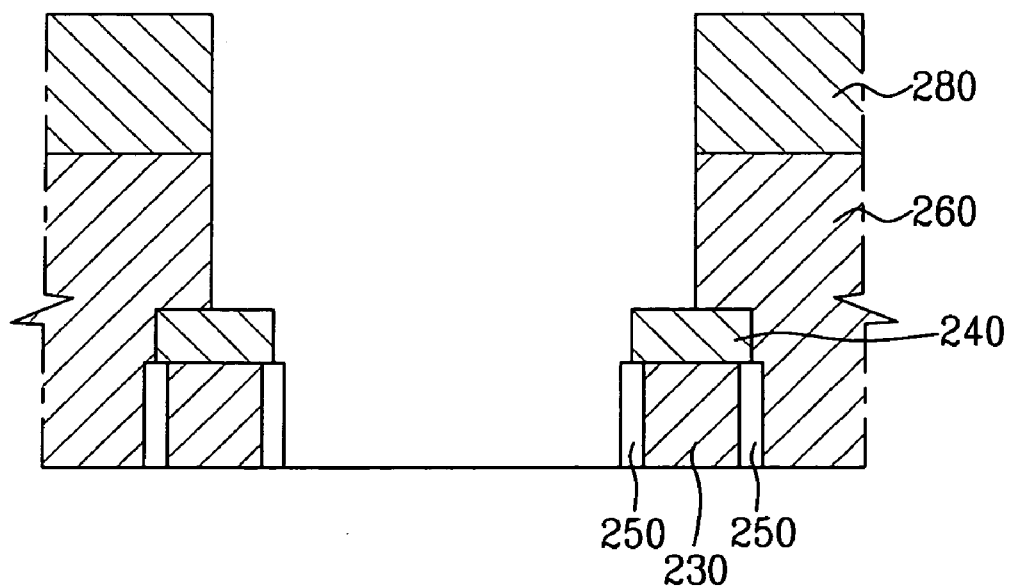

Subsequently, referring to FIG. 4C, an ion implant process is performed on the surface of the second conductive layer 260 and the photoresist residue 270a. When performing the ion implant process, as described above, the photoresist pattern 270 formed on the depression 260a acts as an anti-implant protective layer, thereby allowing doping to occur in the second conductive layer 260 with the exception of the depression 260a. After performing the ion implant process, as shown in FIG. 4D, a photoresist strip (PR strip) process is performed to remove the photoresist pattern 270. Thereafter, referring to FIG. 4E, a photoresist pattern 280 for forming the control gate is formed on the second conductive layer. Finally, as shown in FIG. 4F, an etching process for forming the control gate is performed, thereby forming the control gate.

FIGS. 5A to 5G illustrate cross-sectional views showing the process steps of the method for fabricating a split gate flash memory according to a third embodiment of the present invention. The third embodiment of the present invention is similar to the process described in the first and second embodiments of the present invention, apart from the structure of the anti-implant protective layer and the treatment process.

Figure 5A:
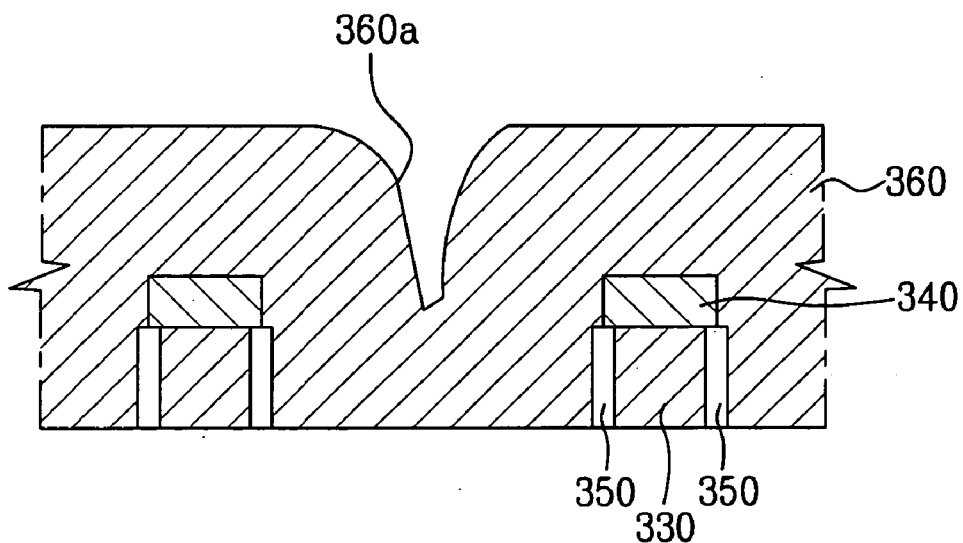
FIGS. 5A to 5G illustrate cross-sectional views showing the process steps of the method for fabricating a split gate flash memory according to a third embodiment of the present invention.
Figure 5B:
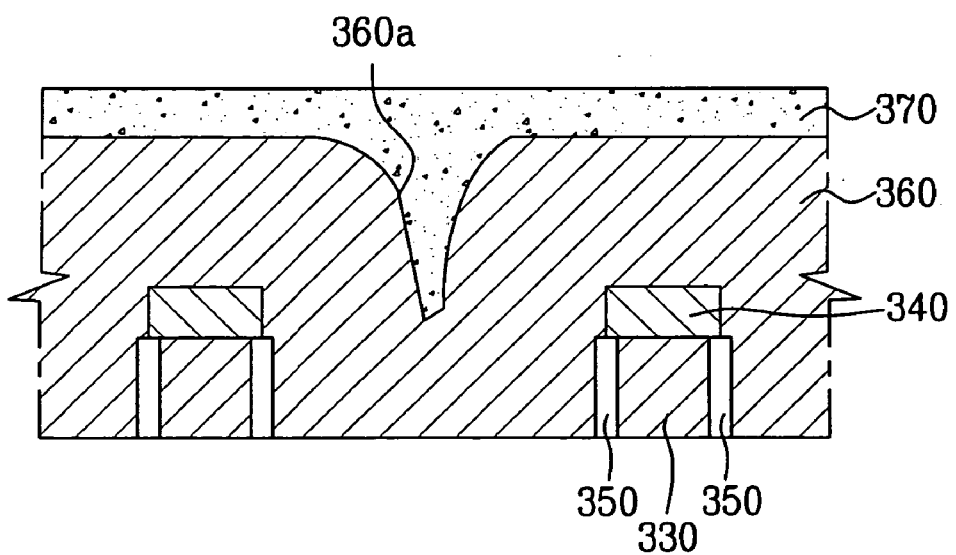
Figure 5C:
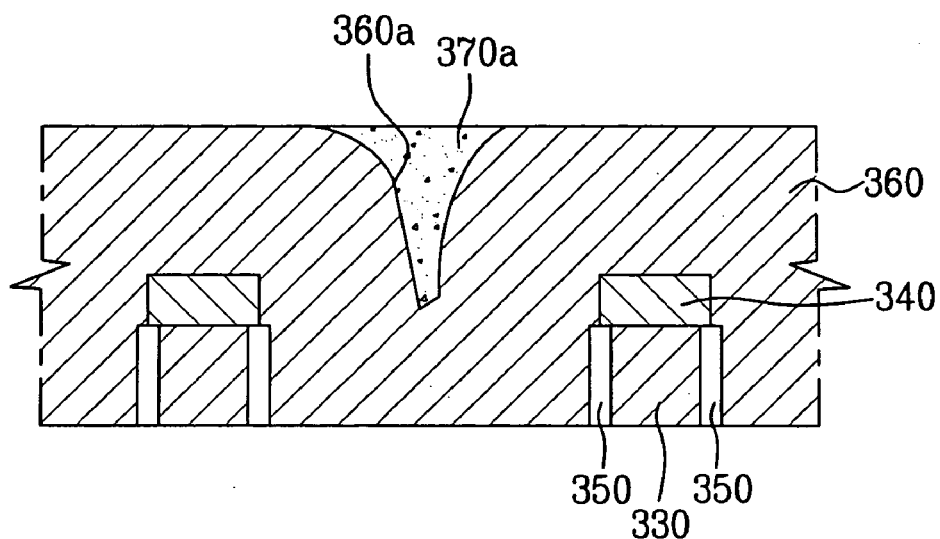

Referring to FIG. 5A, a first conductive layer 330 is formed on a semiconductor substrate, an insulating layer 340 is formed on the first conductive layer 330, and an oxide layer 350 is formed on each side of the first conductive layer 330. Then, a second conductive layer 360 is formed on the entire surface thereof. Then, as shown in FIG. 5B, a nitride layer 370 is formed, as an anti-implant protective layer on the second conductive layer 360. Subsequently, referring to FIG. 5C, the nitride layer 370 is treated with a nitride etch back process, so as to remove the nitride layer 370 with the exception of the area of the depression 360a, thereby forming a nitride residue 370a in the depression 360a.

Figure 5D:
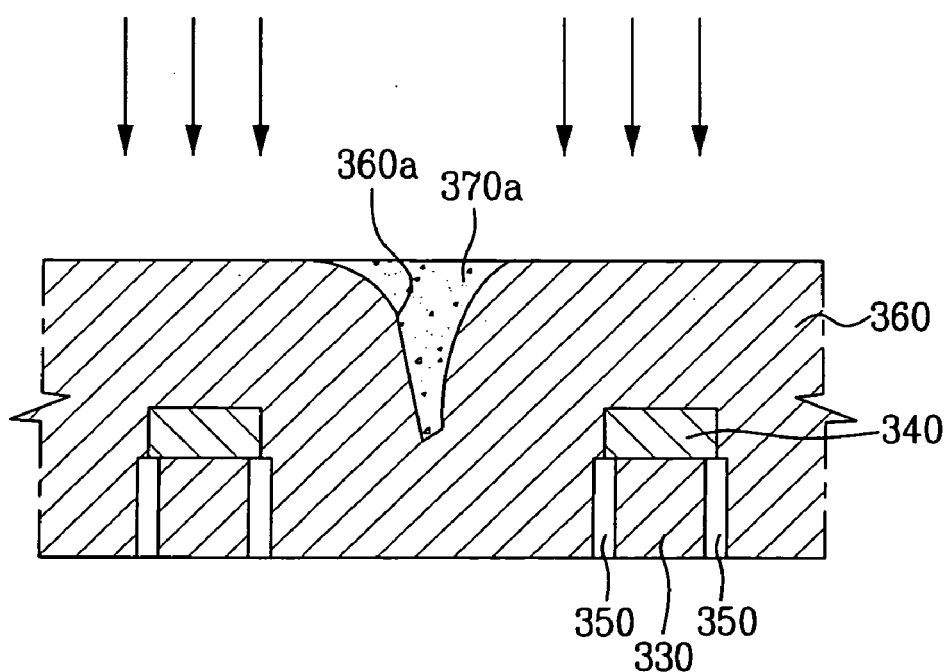
Figure 5E:
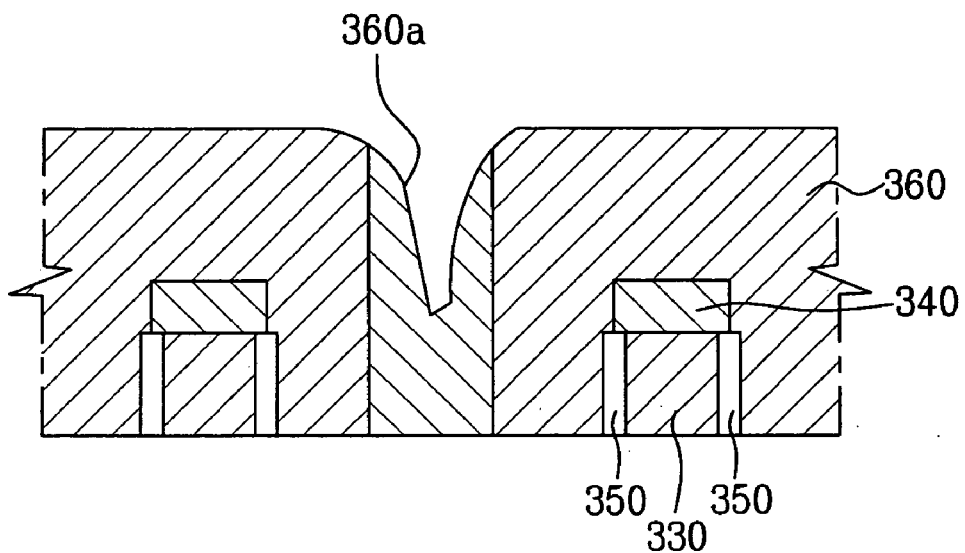
Figure 5F:
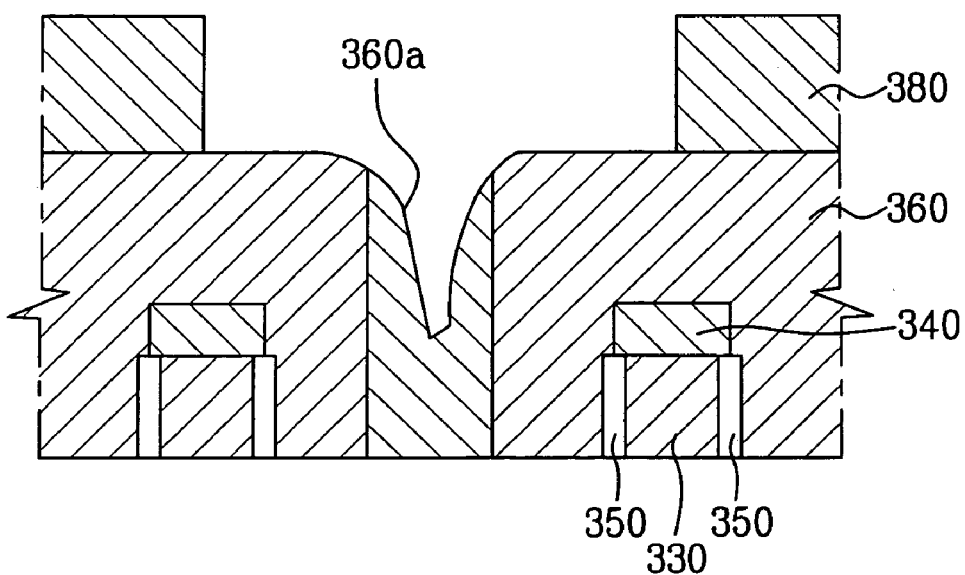
Figure 5G:
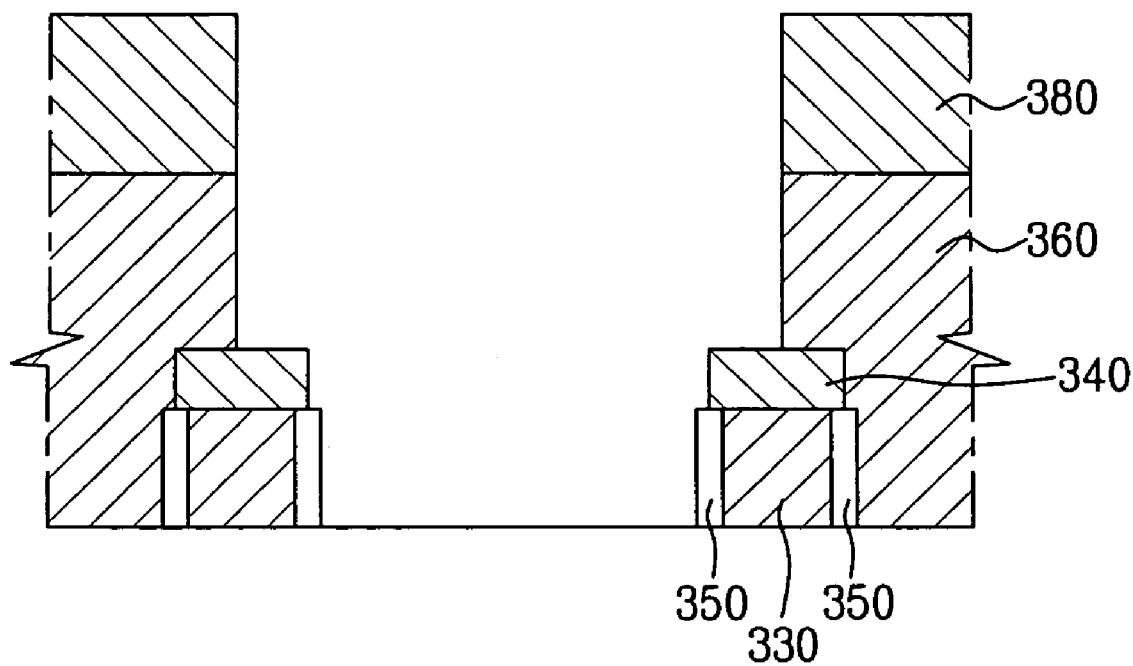

Thereafter, as shown in FIG. 5D, an ion implant process is performed on the surface of the second conductive layer 360 and the nitride residue 370a. When performing the ion implant process as described above, the nitride residue 370a prevents doping from occurring in the depression 360a of the second conductive layer 360. In other words, doping is performed on the entire surface with the exception of the depression 360a area. After performing the ion implant, as described above, referring to FIG. 5E, a nitride wet-etch process is performed, so as to remove the nitride residue 370a from the depression 360a. Subsequently, as shown in FIG. 5F, a photoresist pattern 380 for forming the control gate is formed on the second conductive layer. Finally, as shown in FIG. 5G, an etching process for forming the control gate is performed, thereby forming the control gate.

As described above, the method for fabricating the split gate flash memory according to the present invention has the following advantages. By using the difference in etch rate between the doping area and the non-doping area, a different etch rate is applied to a depression part, which is caused by step differences between floating gates occurring during the forming of the control gate, and the area excluding the depression part, thereby preventing non-etched polymer residue from being produced during the etching process, and, accordingly, enhancing the electrical characteristics of the flash memory device.

This application claims the benefit of Korean patent application No. 10-2003-0101753, filed on Dec. 31, 2003, the entire contents of which is hereby incorporated by reference as if fully set forth herein.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a split gate flash memory device having a first gate and a second gate, comprising steps of:

depositing a second conductive layer for forming a control gate on a semiconductor substrate having a first conductive layer, an insulating layer, and an oxide layer on both sides of the first conductive layer formed sequentially thereon;

filling an anti-implant protective layer in a depression of the second conductive layer between first and second gates;

performing ion implant process on the second conductive layer;

removing the anti-implant protective layer filled in the depression of the second conductive layer;

forming a photoresist pattern by depositing a photoresist layer on the second conductive layer for forming a control gate, and treating the photoresist layer with a light exposure process and a development process; and forming the control gate by etching the second conductive layer.

2. The method of claim 1, wherein the steps of filling an anti-implant protective layer in a depression of the second conductive layer comprises:

forming a photoresist layer as the anti-implant protective layer on the second conductive layer including the depression; and performing an etching process on the photoresist layer, so as to remove the photoresist layer except for the depression.

3. The method of claim 1, wherein the steps of filling an anti-implant protective layer in a depression of the second conductive layer comprises forming a photoresist layer as the anti-implant protective layer on an area of the second conductive layer corresponding to the depression.

4. The method of claim 1, wherein:

the steps of filling an anti-implant protective layer in a depression of the second conductive layer comprises depositing a nitride layer as the anti-implant protective layer on the second conductive layer, and performing an etch back process on the nitride layer, so as to remove the nitride layer except for the depression, and the steps of performing an etching process on the photoresist layer, so as to remove the photoresist layer except for the depression comprises performing a wet-etch process to remove the nitride layer filled in the depression.

5. The method of claim 1, wherein the ion implant process includes nitrogen (N+) implant.

6. A method for fabricating a split gate flash memory device having a first gate and a second gate, comprising steps for:

depositing a second conductive layer for forming a control gate on a semiconductor substrate having a first conductive layer, an insulating layer, and an oxide layer on both sides of the first conductive layer formed sequentially thereon;

filling an anti-implant protective layer in a depression of the second conductive layer between first and second gates;

performing ion implant process on the second conductive layer;

removing the anti-implant protective layer filled in the depression of the second conductive layer;

forming a photoresist pattern by depositing a photoresist layer on the second conductive layer for forming a control gate, and treating the photoresist layer with a light exposure process and a development process; and forming the control gate by etching the second conductive layer.

* * * * *